United States Patent
Gangstoe et al.

(10) Patent No.: US 7,113,122 B2
(45) Date of Patent: Sep. 26, 2006

(54) CURRENT SENSING ANALOG TO DIGITAL CONVERTER AND METHOD OF USE

(75) Inventors: Gunnar Gangstoe, Trondheim (NO); Arne Aas, Trondheim (NO)

(73) Assignee: Atmel Corporation, San Jose, CA (US)

( * ) Notice: Subject to any disclaimer, the term of this patent is extended or adjusted under 35 U.S.C. 154(b) by 4 days.

(21) Appl. No.: 11/043,648

(22) Filed: Jan. 25, 2005

(65) Prior Publication Data

US 2006/0158363 A1    Jul. 20, 2006

(51) Int. Cl.
*H03M 1/12*    (2006.01)
(52) U.S. Cl. .................. 341/155; 341/143; 320/128; 320/132; 702/64
(58) Field of Classification Search ........ 320/127–129, 320/132–133, 165; 702/63–64
See application file for complete search history.

(56) References Cited

U.S. PATENT DOCUMENTS

| | | | | |
|---|---|---|---|---|
| 5,278,487 | A * | 1/1994 | Koenck ...................... | 320/132 |
| 5,408,235 | A * | 4/1995 | Doyle et al. ................. | 341/143 |
| 5,909,188 | A * | 6/1999 | Tetzlaff et al. .............. | 341/155 |
| 6,081,216 | A * | 6/2000 | May .......................... | 341/143 |
| 6,218,809 | B1* | 4/2001 | Downs et al. ............... | 320/132 |
| 6,456,219 | B1* | 9/2002 | Schreiber et al. ........... | 341/155 |
| 6,507,171 | B1* | 1/2003 | Ruha et al. .................. | 320/128 |
| 6,614,374 | B1* | 9/2003 | Gustavsson et al. ........ | 341/143 |
| 6,898,534 | B1* | 5/2005 | Du .............................. | 702/64 |
| 2005/0062457 | A1* | 3/2005 | Galant et al. ............... | 320/128 |

OTHER PUBLICATIONS

Davis, J. *TI Improves Battery Gauge*, Sep. 13, 2004, http://www.reed-electronics.com/electronicnews/ (1 page).
Barsukov et al., *Fuel Gauge Technology Predicts Run Time in Multi-Cell Portable Applications*, http://www.ednasia.com/print.asp?id=108 (5 pages) no date.

\* cited by examiner

*Primary Examiner*—Rexford Barnie
*Assistant Examiner*—Khai Nguyen
(74) *Attorney, Agent, or Firm*—Sawyer Law Group LLP

(57) ABSTRACT

A current sensing analog to digital converter (CS-ADC) is disclosed. The current sensing analog to digital converter comprises a modulator adapted to sense a change in current and generate an oversampled signal. The converter further includes a decimation filter system coupled to modulator for removing out of band noise from the signal and reduce the data rate to achieve a high resolution signal. A current sensing analog to digital converter (CS-ADC) is disclosed that samples the charge or discharge current flowing through an external sense resistor $R_{SENSE}$. The sample from the $R_{SENSE}$ is processed by a delta-sigma modulator which generates an over sampled noise shaped signal. From this signal a decimation filter system removes the out-of band noise and reduces the data rate to achieve a high-resolution signal. The CS-ADC also provides regular current detection. The regular current detection compares the data from conversion against charge/discharge threshold levels specified by the user. To save power a special mode where the user configures the regular current sampling interval is provided. This allows ultra-low power operation in power-save mode when small charge or discharge currents are flowing.

18 Claims, 15 Drawing Sheets

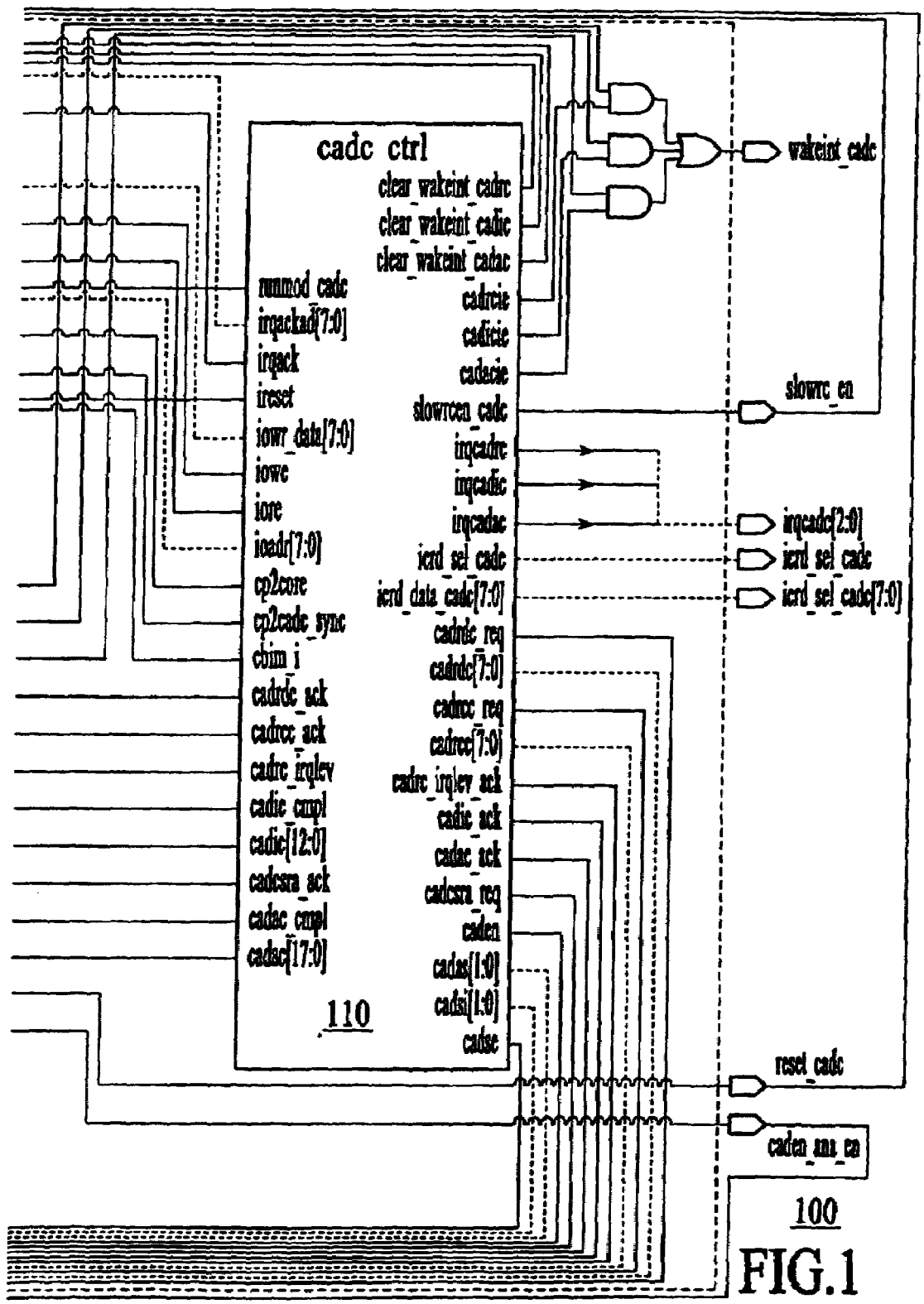
FIG.1 (Continue)

(a)

(b)

(a)

(b)

CURRENT SENSING ANALOG TO DIGITAL CONVERTER AND METHOD OF USE

FIELD OF THE INVENTION

The present invention relates generally to integrated circuits and more specifically to a current sensing analog to digital converter that is utilized in such circuits.

BACKGROUND OF THE INVENTION

In many electronic systems such as systems powered from rechargeable batteries or the like it is important to monitor the current flow in the system. It is important that the current can be measured both quickly to monitor the instantaneous current at a given time, and accurately with high resolution to enable accurate accumulation of the charge flow over time.

In addition it is desirable to provide power saving modes to minimize power consumed to the device. For example, it is desirable to minimize power when the device is not actually being used.

Accordingly it is desirable to sense current flow and provide a mode where the device is not active. Once again this condition must be sensed and measured.

Accordingly, what is desired is a system and method for accurately and quickly detecting current flow in a system. The system and method should be easily implemented in a device, be cost effective and easily adapted to conventional devices.

The present invention addresses such a need.

SUMMARY OF THE INVENTION

A current sensing analog to digital converter (CS-ADC) is disclosed. The current sensing analog to digital converter comprises a modulator adapted to sense a change in current and generate an oversampled signal. The converter further includes a decimation filter system coupled to modulator for removing out of band noise from the signal and reduce the data rate to achieve a high resolution signal.

A current sensing analog to digital converter (CS-ADC) is disclosed that samples the charge or discharge current flowing through an external or internal sense resistor $R_{SENSE}$. The sample from the $R_{SENSE}$ is processed by a delta-sigma modulator which generates an over sampled noise shaped signal. From this signal a decimation filter system removes the out-of band noise and reduces the data rate to achieve a high-resolution signal. The decimation process is split in two to produce an instantaneous current output with resolution and conversion time suitable for instantaneous current measurements, and an accumulate current output signal with conversion time and resolution suitable for charge flow accumulation The CS-ADC also provides regular current detection. The regular current detection compares the data from conversion against charge/discharge threshold levels specified by the user. To save power a special mode where the user configures the regular current sampling interval is provided. This allows ultra-low power operation in power-save mode when small charge or discharge currents are flowing.

DETAILED DESCRIPTION

The present invention relates generally to integrated circuits and more specifically to a current sensing analog to digital converter that is utilized in such circuits. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Overview of the Current Sensing Analog to Digital Converter (CS-ADC)

Figure 1:
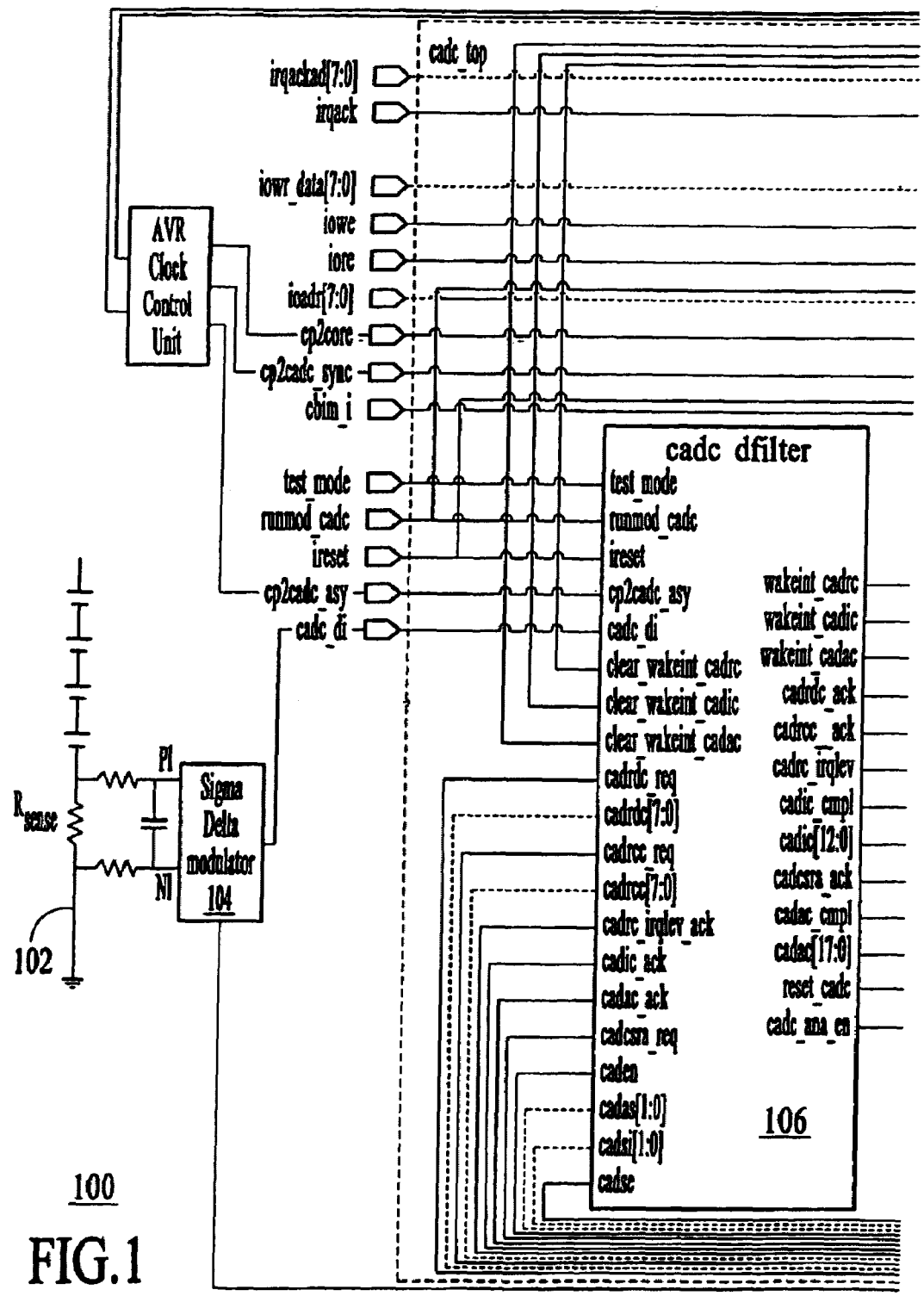
FIG. 1 shows the block diagram of a current sensing analog to digital converter CS-ADC in accordance with the present invention.

FIG. 1 shows the block diagram of a current sensing analog to digital converter CS-ADC 100 in accordance with the present invention.

The CS-ADC 100 is used to sample the charge or discharge current flowing through an external sense resistor $R_{SENSE}$ 102. The CS-ADC 100 could be part of a variety of devices such as a microcontroller, digital signal processor (DSP), digital camera, PDA, or the like. In one embodiment the CS-ADC 100 is part of an 8 bit microcontroller, ATmega 406 manufactured by Atmel Corporation. The sample from the $R_{SENSE}$ 102 is processed by a delta-sigma modulator 104, which generates an over sampled noise shaped (most of the noise energy in high frequencies) 1-bit signal. From this signal two decimation filters, CDAC filter 106, remove the out-of band noise and reduce the data rate to achieve a high-resolution signal.

The two decimation filters generates two data values, instantaneous current and accumulate current. The instantaneous current has a short conversion time at the cost of lower resolution. The accumulate current output provides a highly accurate current measurement for coulomb counting. The conversion time of the accumulation current can be configured to trade accuracy against conversion time.

The CS-ADC 100 also provides regular current detection. The regular current detection compares the data from conversion against charge/discharge threshold levels specified by the user. To save power a special mode where the user configures the regular current sampling interval is provided.

The CS-ADC 100 then performs four instantaneous current conversions (the first 3 conversions are dummy conversions to ensure proper settling of the decimation filter) and compares the last conversion value with the threshold levels specified by the user. If the value is above the threshold a wakeup signal is given to the sleep controller and interrupts for instantaneous and regular current are given. If not the delta-sigma modulator and the decimation filter are turned off for some time, before starting over again. The user specifies the time period the modulator and filter should be turned off. This allows ultra-low power operation in power-save mode when small charge or discharge currents are flowing.

The filter generates interrupts on conversion complete from the instantaneous current and accumulation current, and when a regular current is detected.

In a preferred embodiment, the CS-ADC system uses three clock sources.

In a preferred embodiment, both the modulator 104 and the decimation filters 106 run at a predetermined clock frequency such as 32 kHz. This clock runs in all sleep modes. The output data from the modulator 104 is valid from negative to negative edge, and decimation filters samples the modulator data at positive edge of this clock.

The I/O interface 110 is updated on both cp2core and cp2cadc_sync, which are synchronous to the CPU clock domain (1 MHz). The cp2core only runs in active, but the cp2cadc_sync runs in active, idle and ADC-NRM.

Because of the asynchronous clock domains between the filter and the I/O interface 110, synchronization is necessary to avoid metastability. All signals crossing clock domains are synchronized inside the module using the signal.

To save power, the CS-ADC 100 could be turned off by writing zero to the ENABLE bit in a Control and Status Register A. This will turn off biasing for the modulator, and keep the decimation filters in IDLE state where nothing is computed. The asynchronous clock (cp2cadc_asy) is stopped if an RC oscillator is selected and all sources using this clock is disabled.

Operation of the CS-ADC

The following describes the operation of a specific implementation of the CS-ADC 100. It should be understood that the data sizes, times and registers could be a variety of types and sizes and their use would be within the spirit and scope of the present invention. The CS-ADC 100 is enabled by setting the CADEN bit in the CADCSRA I/O register. The enable signal is used to enable/disable the biasing for the modulator and to enable/disable the decimation filters.

The decimation filter 106 will start computing when the synchronized CADEN signal goes high. The 3rd order sinc-filter of the decimator filter 106 outputs a 13-bit data, instantaneous current, every 3.9 ms (every 128 cp2cadc_asy clock period) using the 1-bit input from the modulator. The 1st order sinc-filter of the decimation filter 106 further computes this signal and output a 18-bit conversion, accumulation current value, every 125, 250, 500 or 1000 ms, specified be the value of the CADAS[1:0] in the CADCSRA I/O register. For each converted data value the filters toggles complete signals. The I/O interface 110 will detect the complete signals and set the corresponding flag, which generate interrupt if enabled.

When converting data, the instantaneous current conversion is compared against the values of the synchronized charge/discharge current thresholds. If the value is above the absolute value of the threshold levels, the regular current interrupt flag will be set, and an interrupt is given if the interrupt is enabled.

If the CADSE bit in the CADCSRA I/O register is set, the CS-ADC 100 operates in a special regular charge current mode to reduce power. Only the 3rd order sinc-filter is enabled, and the CS-ADC 100 will be turned off for periods specified by the CADSI[1:0] bits in the CADCSRA I/O register. When entering this mode the filters will be reset and 4 instantaneous current conversions is computed, before the last conversion value is compared against the threshold levels. If a regular current interrupt level is not detected, the filter is halted and the analog modulator is turned off for ¼, ½, 1 or 2 seconds depending on CADSI[1:0]. Starting over again the filter is flushed and the same is repeated. This repeats until CADSE bit is cleared. When the CADSE bit is cleared the filters are flushed and normal operation is started.

The internal filter values of the decimation filter 106 are flushed each time the CS-ADC 100 is disabled, when entering/leaving the regular current sampling mode and after the being turned off in the regular current detection mode.

To describe the features of the decimation filter 106 in more detail, refer now to the following discussion in conjunction with the accompanying figures.

Decimation Filter 106

Overview

A narrow-band low pass decimation filter is used to achieve high resolution and to lower the sample rate from the output of the 1 bit Delta Sigma Modulator. The filter is a cascade of two filter stages. The first stage is a third order sinc filter with a data output and for reducing the data rate by a predetermined number such as 128. The second stage is a first order sinc filter with a data output and for reducing the data rate with a configurable decimation ratio such as 32, 64, 128 and 256.

Both filter stages are implemented using a CIC structure, where data is accumulated, decimated and differentiated. In a preferred embodiment, computations are performed using wrap around 2 s complement arithmetic.

Figure 2:
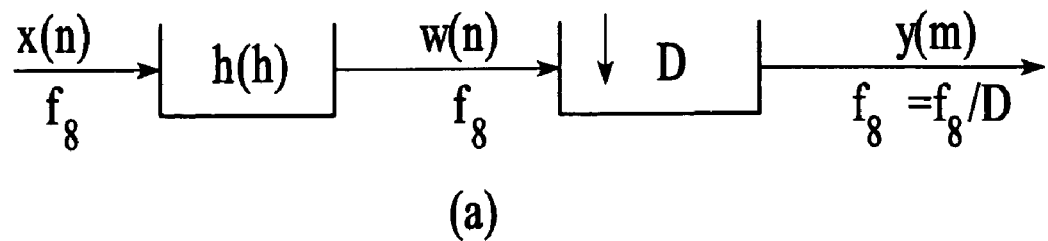
FIG. 2 illustrates the reducing of the sampling rate, $f_s$, by an integer factor D in the frequency domain.
Figure 2:
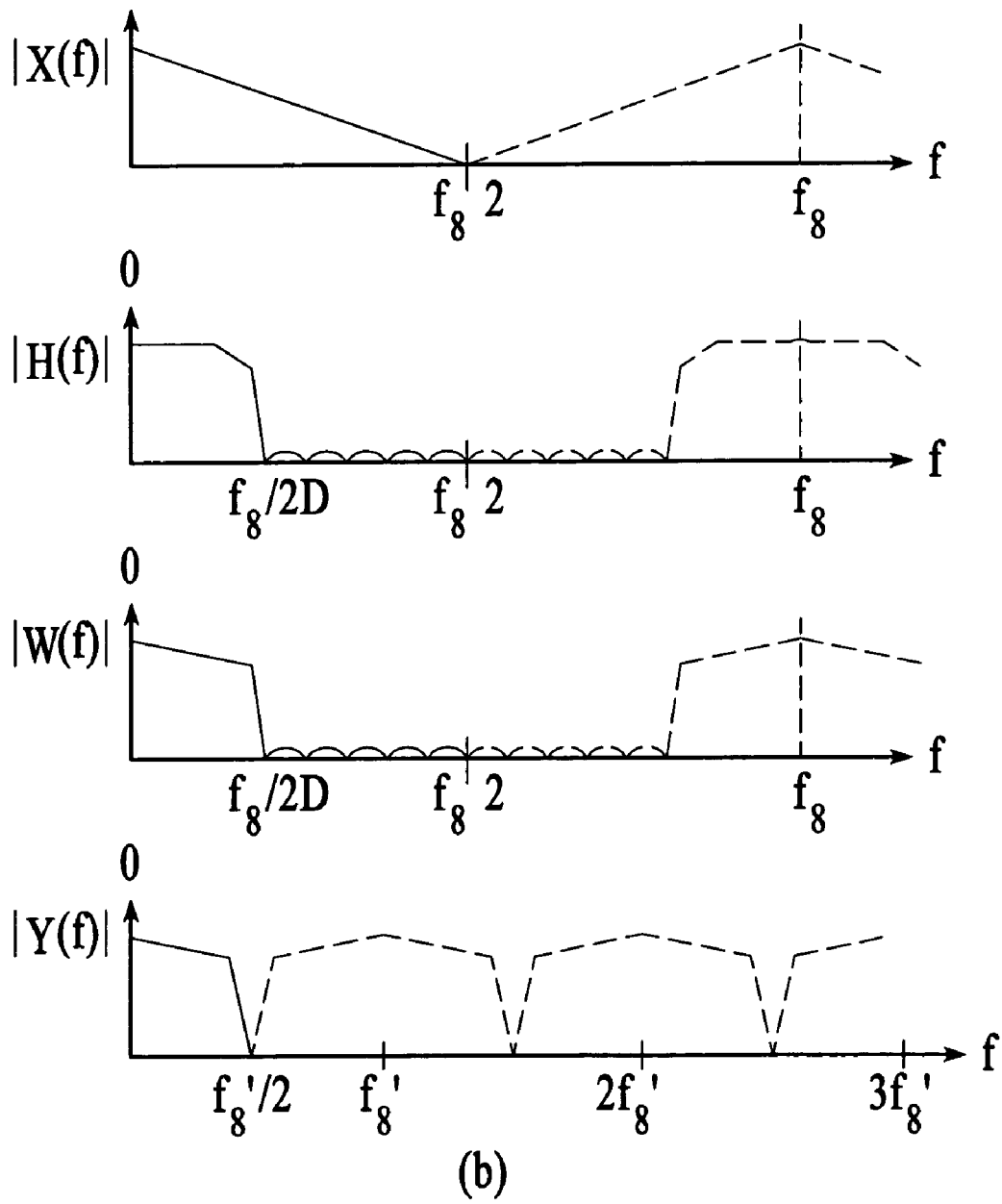

Referring to FIG. 1, the delta output of the delta sigma modulator 104 represents the input signal together with its noise shaped in-band and out-of-band components, circuit noise and all kinds of interference from substrate, power supply, clocks and etc. As before mentioned, the purpose of the decimation filter 106 is to band limit the input spectrum with a low-pass filter before down sampling the signal. To avoid that the out-of-band noise decrease the SNR when the data rate is reduced to eliminate redundant data, the aliasing effects must be constraint well below the specific level. FIG. 2 illustrates the reducing of the sampling rate, $f_s$, by an integer factor D in the frequency domain.

If the sampling rate is reduced by simply selecting every Dth value, the resulting signal will be an alias version of x(n), with a folding frequency of $f_s/D$. The input signal x(n) is therefore digitally filtered by a low-pass filter, h(n), with cutoff frequency of $f_s/2D$, where $f_s$ is the sampling frequency at the input of the filter. By filtering out all signal energy in x(n) above the frequency $f_s/2D$, aliasing is avoided in the decimation process, and the out-of-band quantization noise from the modulators output is thereby removed.

The Sinc Filter

In a preferred embodiment, each of the sinc filters are linear phase FIR filters that are widely used in $\Delta\Sigma$ converters. A major reason for this is its simple structure, which requires no multipliers. The transfer function for a sinc filter has the general form:

$$H(z) = \left(\sum_{n=0}^{D-1} z^{-n}\right)^k = \left(\frac{1-z^{-D}}{1-z^{-1}}\right)^k \quad \text{(Equation 2)}$$

and its frequency response is therefore $$|H(e^{j\omega})| = \left(\frac{1}{D} \cdot \frac{\sin(\omega D/2)}{\sin(\omega D)}\right)^k \quad \text{(Equation 3)}$$

It has D/2 spectral zeros if D is even, or (D−1)/2 if D is odd, at frequencies that are multiples of the decimated sampling frequency $\omega_d$, that is $$H(e^{j\omega})=0, \omega=n \cdot \omega_d, n=\{1,2,3,\ldots,D/2\} \quad \text{(Equation 4)}$$

Figure 3:
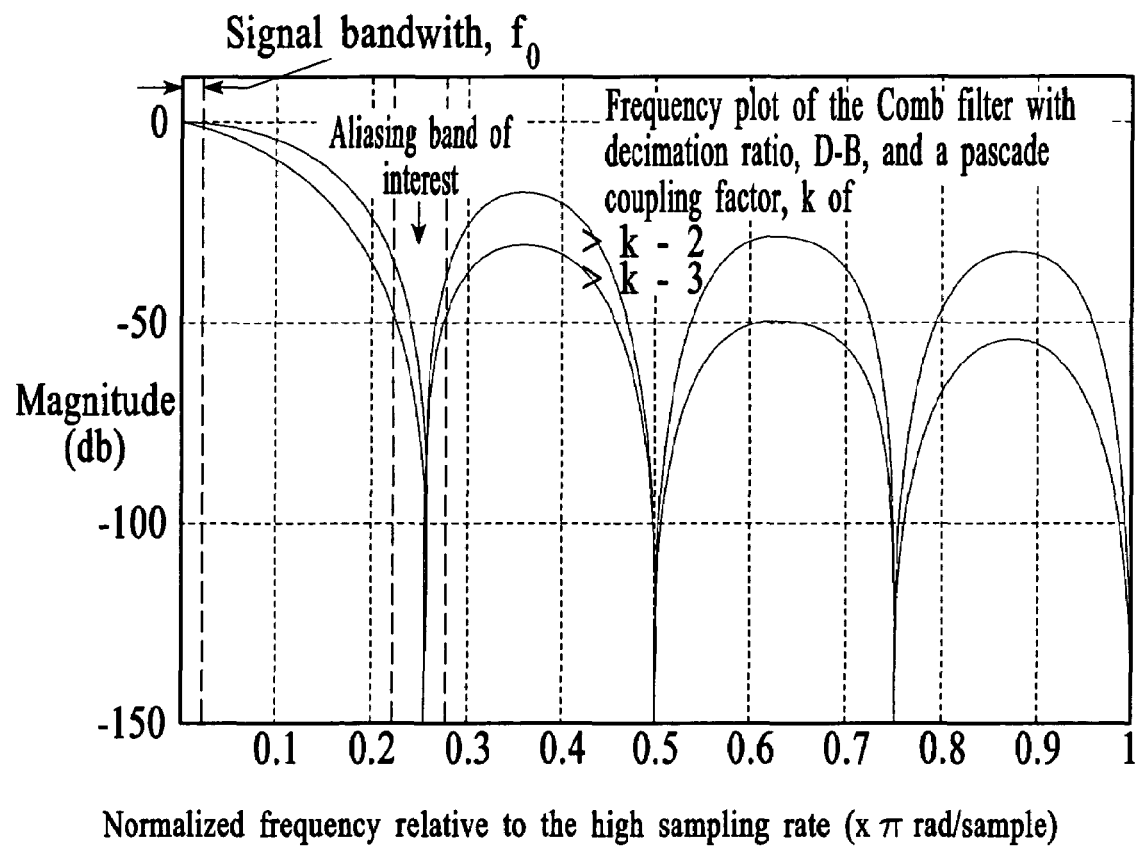
FIG. 3 illustrates an example of the sinc filter frequency response with a decimation D=8.

FIG. 3 illustrates an example of the sinc filter frequency response with a decimation D=8.

CIC Structure

Figure 4:
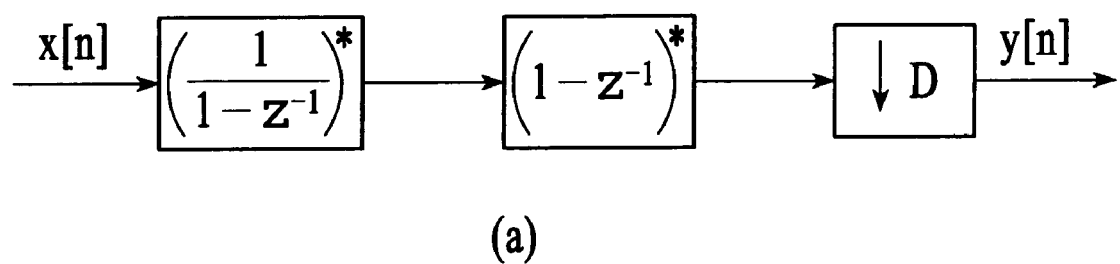
FIG. 4 shows the block diagram of the sinc filter and cascade integrator comb combinations (CIC) implementation structure.
Figure 4:
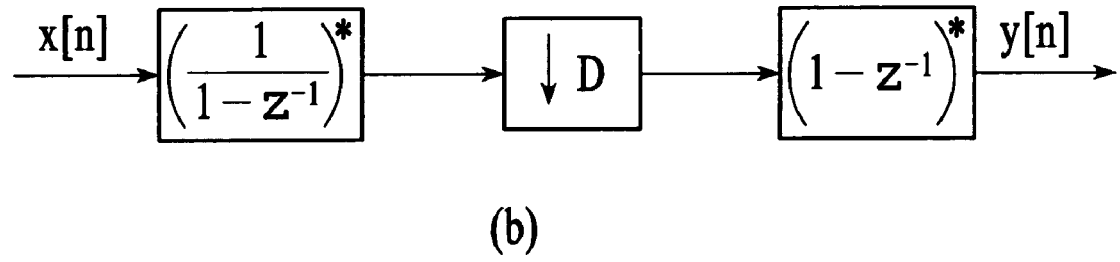

FIG. 4 shows the block diagram of the sinc filter and cascade integrator comb combinations (CIC) implementation structure. Note that in the CIC structure the decimation filter is moved in front of the differentiator. Thus the integrator section is operating at high input sampling rate, while the differentiator/comb section is operating at a lower sampling rate. To describe the operation of the CIC structure in a particular environment, refer now to the following description in conjunction with the accompanying figures.

Operation

The filter will start computing when the enable signal goes high. An instantaneous current outputs a 13-bit value every 128-clock period. Accumulation current can be configured to output every 4096, 8192, 16394 or 32768 period. Both conversions will generate interrupts when a conversion is finished. The instantaneous current will be compared against charge and discharge current values, which is specified by the user. If the instantaneous value exceeds the charge or discharge current, an interrupt is generated.

The CS-ADC 100 (FIG. 1) operates in special mode in power-down. Only the sinc-filter (which computes the instantaneous current) and the charge/discharge current comparison will be enabled. The CS-ADC in this embodiment will perform 4 conversions, and compare the data from last conversion with the threshold levels. If the value exceeds thresholds the interrupts are generated and the micro-controller wakes up from Power-down. If not, the filter will remain in Power-down, but it will be turned off for a time specified by the user (250, 1000, or 2000 ms) before starting over again.

Implementation

Sinc-Filters

CIC Implementation

Figure 5:
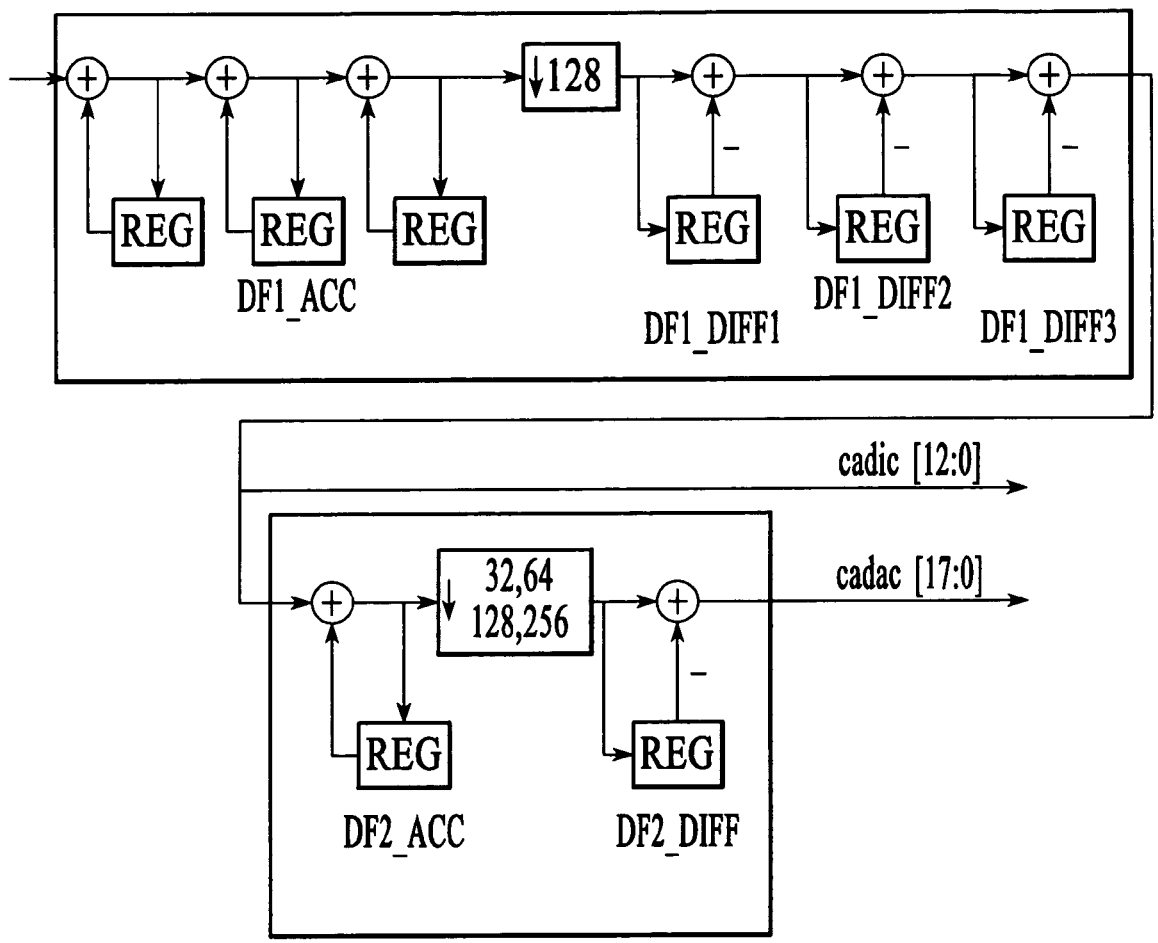
FIG. 5 shows the straightforward CIC implementation of the two decimation filter stages.
Figure 6:
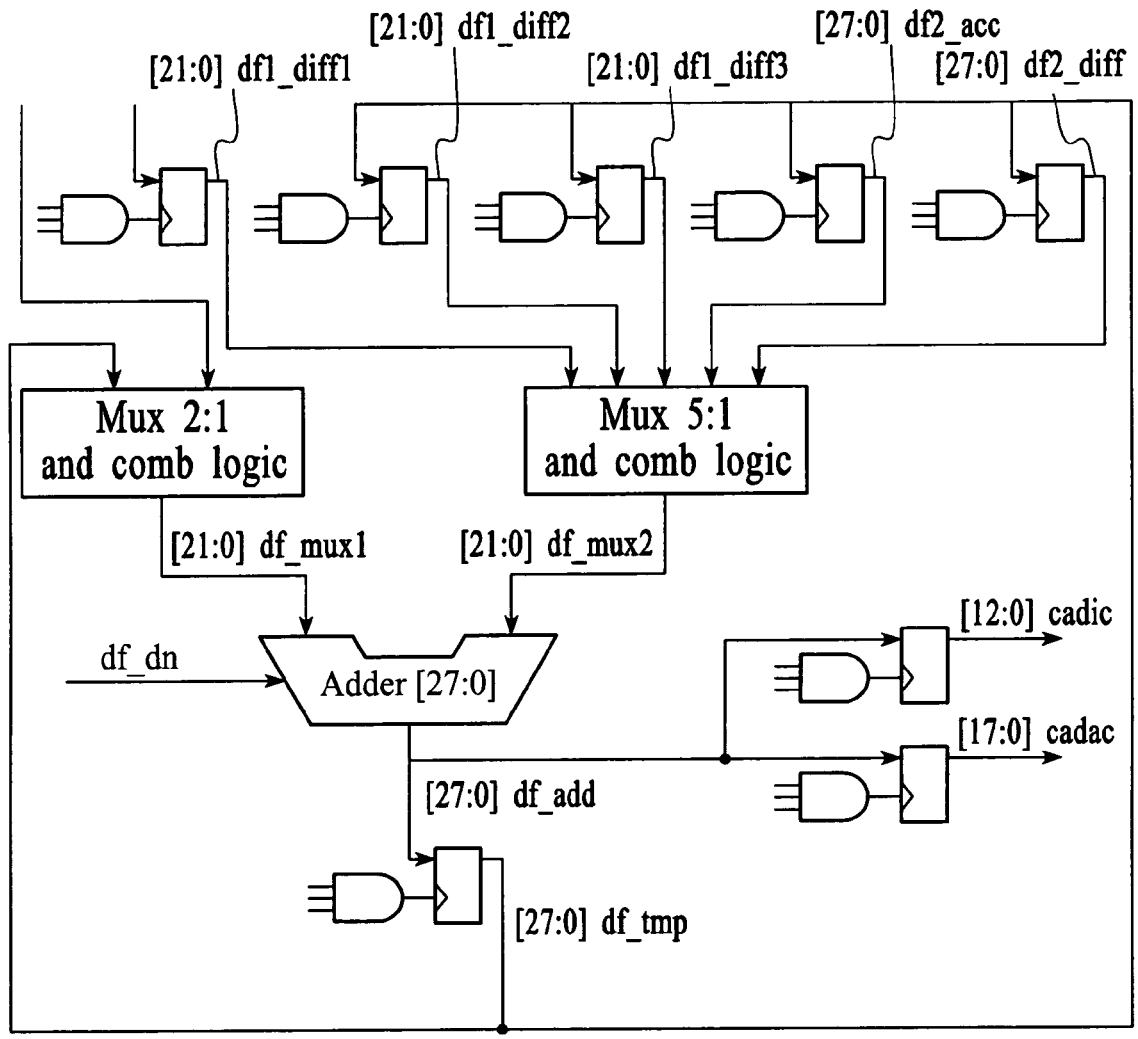
FIG. 6 shows the basic block diagram of the cadc_d filter implementation structure.

FIG. 5 shows the straightforward CIC implementation of the two decimation filter stages. The first accumulator/integrator section will run at full speed. The accumulator stages can easily be pipelined to reduce the adders speed requirements, simply by moving the registers in at the output of each adder. Since the data rate is reduced at the output of the integrator section of the first decimation filter, the resources can be shared to save area. FIG. 6 shows the basic block diagram of the decimation filter implementation structure. Internal control signals to ensure correct operation flow are not included in the figure, but these signals are generated in the same module.

Data Representation

A number system that allows wrap-around is preferably used when implementing the filters. The internal data format is therefore two's complement. The value of a normalized Wd-bit binary word in two's complement representation is $$x = -x_0 + \sum_{i=1}^{\omega_d-1} x_i 2^{-i} \quad \text{(Equation 5)}$$

and the values lie in the range $-1 \leq x \leq 1-2^{-(\omega_d-1)}$, where MSB represent the sign bit.

Internal Word Requirements

The range of the number system in a preferred embodiment could be equal or exceed the maximum magnitude at the output of the filter. To ensure stability in a CIC filter implementation, each accumulator and differentiator needs $$W = B_{in} + k \cdot \log_2 D \quad \text{(Equation 6)}$$

bits, where $B_{in}$ is the number of input bits, k is the number of cascade stages in the filter, and D is the decimation of the CIC filter.

In the first filter stage the internal word length is 22 bits, and all accumulators use separate 22 bits wrap-around single cycle adders.

To avoid that, the in-band noise floor is increased such as 18 bits accuracy is impossible, the second filter stage should use 19 or more of the output bits from the first filter stage. 22 bits from the first filter stage is therefore truncated to 20 bits. The internal word length of the second decimation filter is given in Table 1.

Table 1—Internal word length of second decimation filter stage with 20 bits input from stage 1

TABLE 1

| Internal word length of second decimation filter stage with 20 bits input from stage 1 | |
|---|---|
| Decimation in second filter stage | Internal word length when 20 bits input |
| 32 | 25 |
| 64 | 26 |
| 128 | 27 |
| 256 | 28 |

As shown in FIG. 6, the differentiator in stage 1 and both the accumulation and differentiation in stage 2 uses the same adder for all configuration of decimation. To be able to do this sign extension and zero padding control is used at the input of the adder. For details, see comments in the verilog module.

Regular Current Comparison

Figure 7:
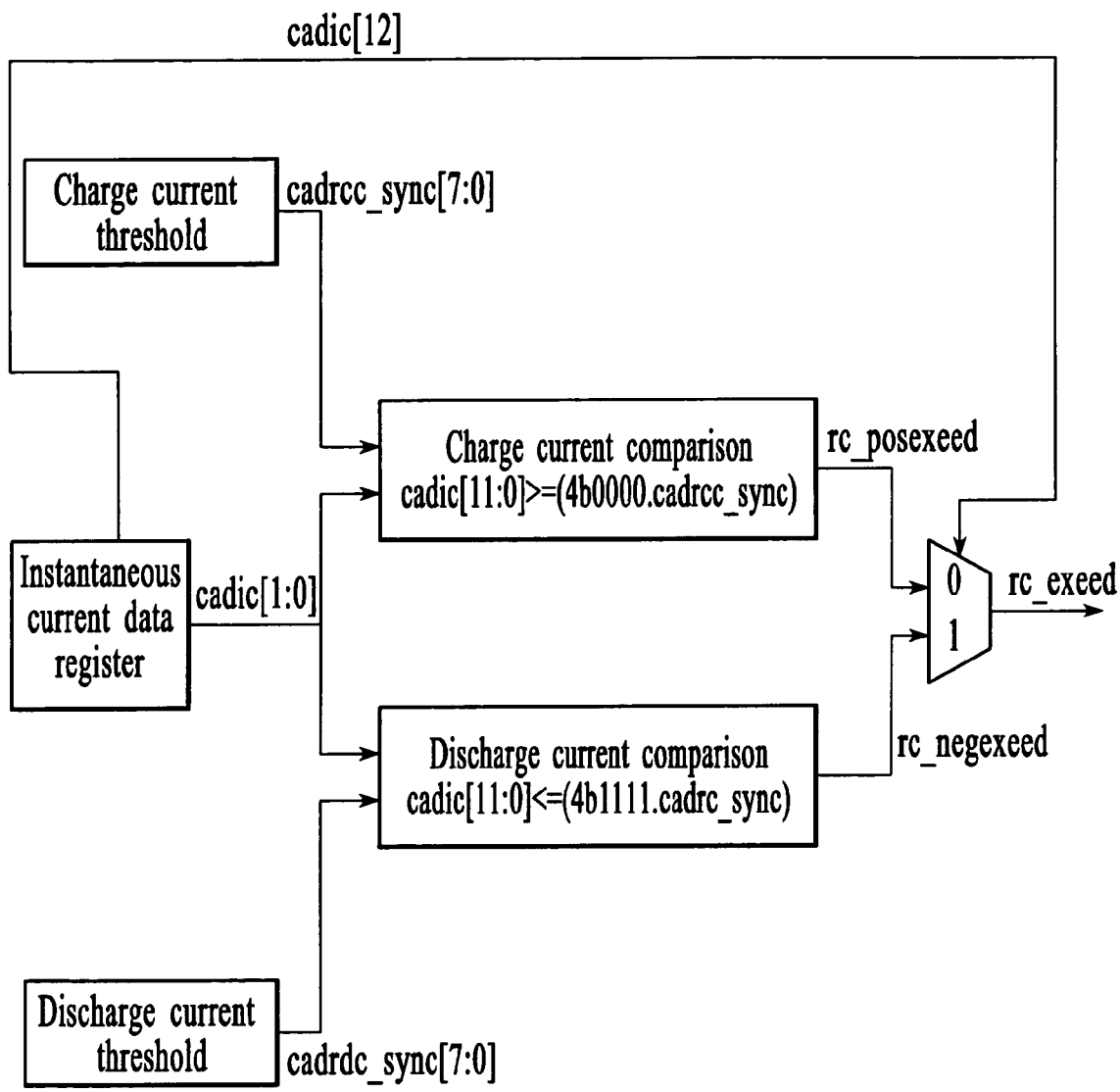
FIG. 7 shows the regular current comparison logic.

FIG. 7 shows the regular current comparison logic. The instantaneous Current is compared with both Charge and Discharge threshold, and the sign bit from the Instantaneous Current selects which comparison to use.

Decimation Filter Control

The internal computation flow control, which ensures correct sequence of operation, is a part of the filter module. The control is implemented using three counters and a Finite-State-Machine.

Counter 1 is a 7-bit counter used to control the decimation in the first decimation filter, which reduces the data rate with 128.

Counter 2 is a 8-bit configurable counter, which controls the decimation in the second decimation filter. How to count is determined by the CADAS[1:0] configuration value.

The last counter is used for comparison control and as an extension of the existing counters in Power-down mode.

Figure 8:
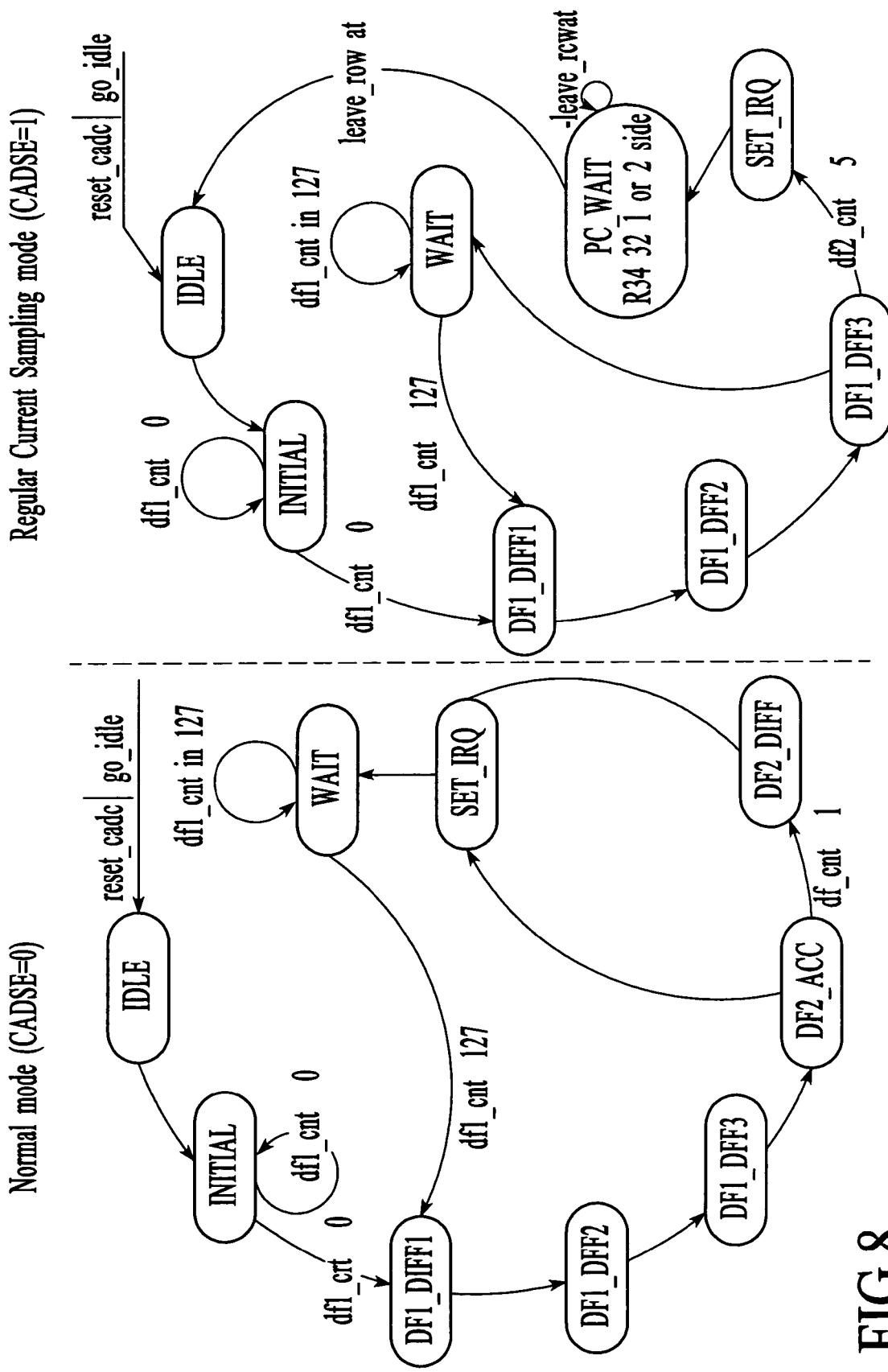
FIG. 8 shows the states of the state machine.

The finite state machine controls the sequence of computation in the filter. FIG. 8 shows the states of the state machine. Table 2 explains the states in the state diagram.

Table 2—Description of states in the Finite State Machine

TABLE 2

Description of states in the Finite State Machine

| State | Description |
|---|---|
| IDLE | In this state nothing is computed. When synchronized enable goes high, the state machine goes from IDLE to INITIAL and the computation starts. |
| INITIAL | Sequence through the pipeline stages |
| DF1_DIFF1 | Computes the first differentiation in the first filter stage. |
| DF1_DIFF2 | Computes the second differentiation in the first filter stage. |
| DF1_DIFF3 | Computes the third differentiation in the first filter stage. |
| DF2_ACC | Computes the accumulation in the second filter stage. |
| DF2_DIFF | Computes the differentiation in the second filter stage. |
| SET_IRQ | Toggle complete for conversions. Toggle Regular Current Detection Level is the Instantaneous Current exceeds thresholds. |
| WAIT | Decimates by 128. Nothing is computed. |
| RC_COMPARE | Check 13 bit data with threshold levels. |
| RC_WAIT | Wait for ¼, ½, 1 or 2 seconds, if conversion result is within limits. |

Synchronization of Signals Crossing Clock Domains

Multiple Clock Domains and Metastability

Several clock domains exist and thus the cadc design is asynchronous. The following section describes the synchronization between the different clock domains.

In this embodiment, the decimation filter operates at 32 kHz clock while the I/O interface runs at 1 MHz. When a signal crosses a clock domain, it appears to the circuitry in the new clock domain as an asynchronous signal. The circuit that receives this signal needs to synchronize it. Synchronization prevents the metastable state of the first storage element (flip-flop) in the new clock domain from propagating through the circuit.

When a flip-flop enters a metastable state, you can neither predict the element's output voltage level nor when the output will settle to a correct voltage level. During this settling time, the flip-flop's output is at some intermediate voltage level or may oscillate and can cascade the invalid output level to flip-flops farther down the signal path.

The purpose of synchronizing signals is to protect downstream logic from the metastable state of the first flip-flop in a new clock domain. A simple synchronizer comprises two flip-flops in series without any combinational circuitry between them. This design ensures that the first flip-flop exits its metastable state and its output settles before the second flip-flop samples it. To ensure the smallest possible clock skew between them it is needed to place the flip-flops close to each other.

CS-ADC Synchronization

In this design all control signals crossing clock domains are synchronized using the two stage flip-flops. Data signals are copied from one domain to another using the synchronized control signals to generate enables. All control signals crossing into a faster clock domain has asynchronous reset, for correct initialization of the synchronization logic.

Figure 9A:
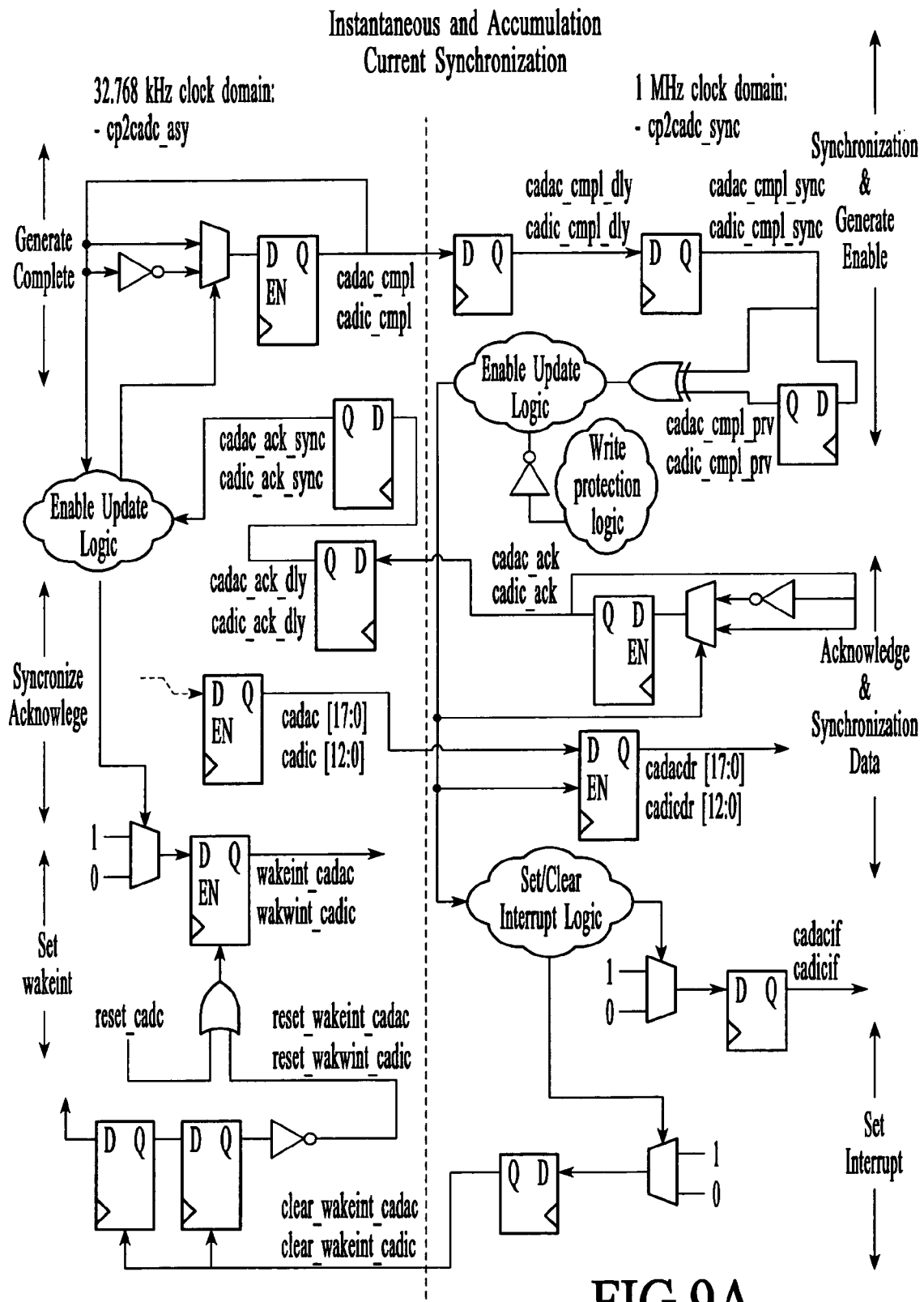
FIGS. 9a and 9b show the synchronization between signals coming from the slow clock domain.
Figure 9B:
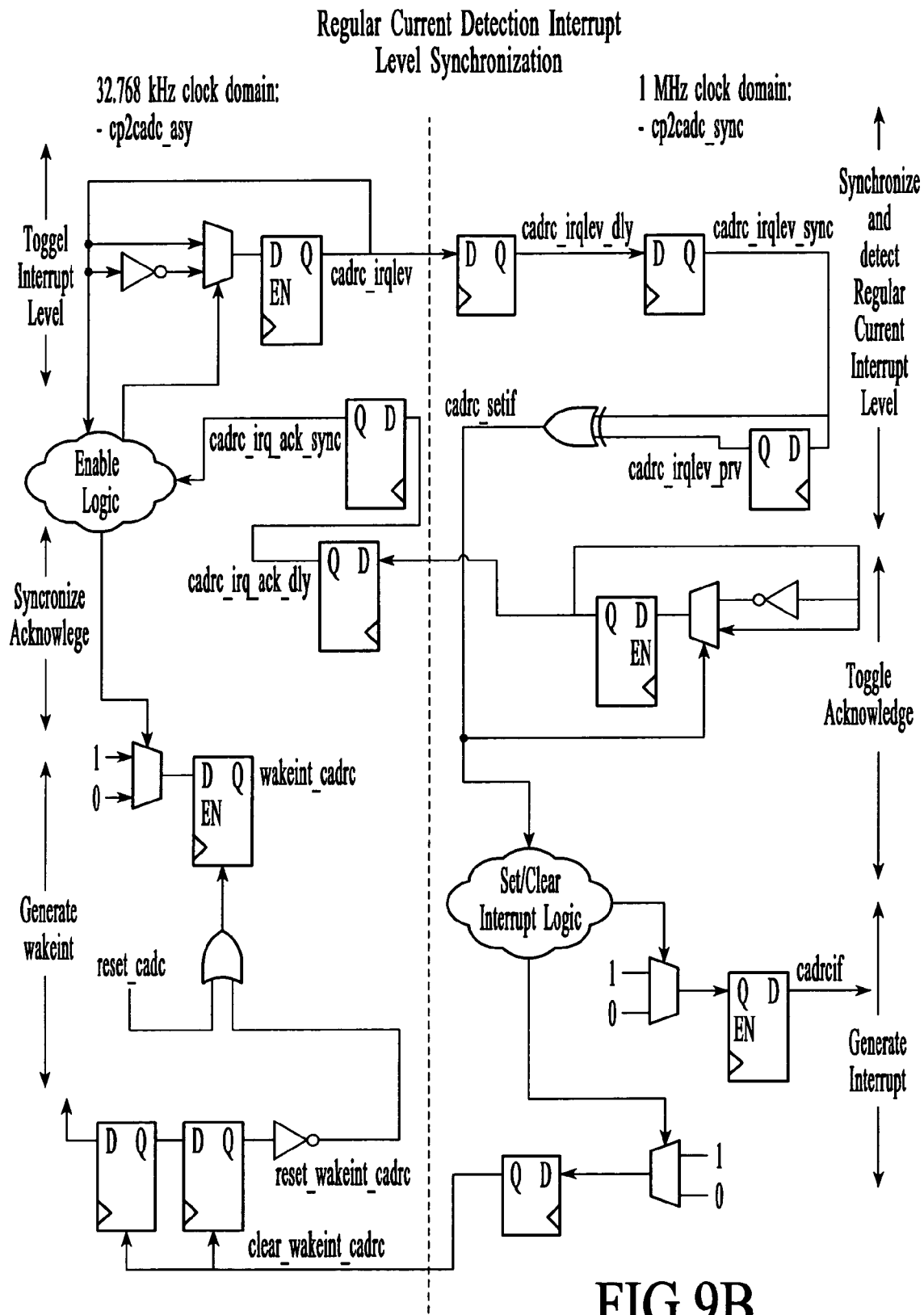

FIGS. 9*a* and 9*b* show the synchronization between signals coming from the slow clock domain, cp2cadc_asy (from cadc_dfilter), which are used in the fast clock domain, cp2cadc_sync (to cadc_ctrl).

The instantaneous and accumulation conversion synchronization is equal. When a conversion is ready, the complete signal is toggled. The complete signal is synchronized in the fast clock domain using a two-stage synchronizer. Whenever a new edge is detected on the synchronized complete signal, this generates an enable, which will copy the data register in the slow clock domain into the fast clock domain and generate an interrupt (if enabled), and toggle back acknowledge for the copying. When updating the data register, the interrupt flag is also set. Note however that the data, acknowledge and the interrupt flag registers are write protected. If only the low byte has been read from previous conversion this will block updating, until the high byte has been read. Reading the high byte, the new data value, acknowledge toggling, and interrupt flag will be set on the next clock period. In the slow clock domain, new data and complete signal is blocked until acknowledge has been given.

The regular current detection will generate a toggle on the regular current interrupt level if the instantaneous current is above the absolute value of the regular charge/discharge current. The Interrupt will be generated using the basic synchronizer followed by an edge detector.

Figure 10:
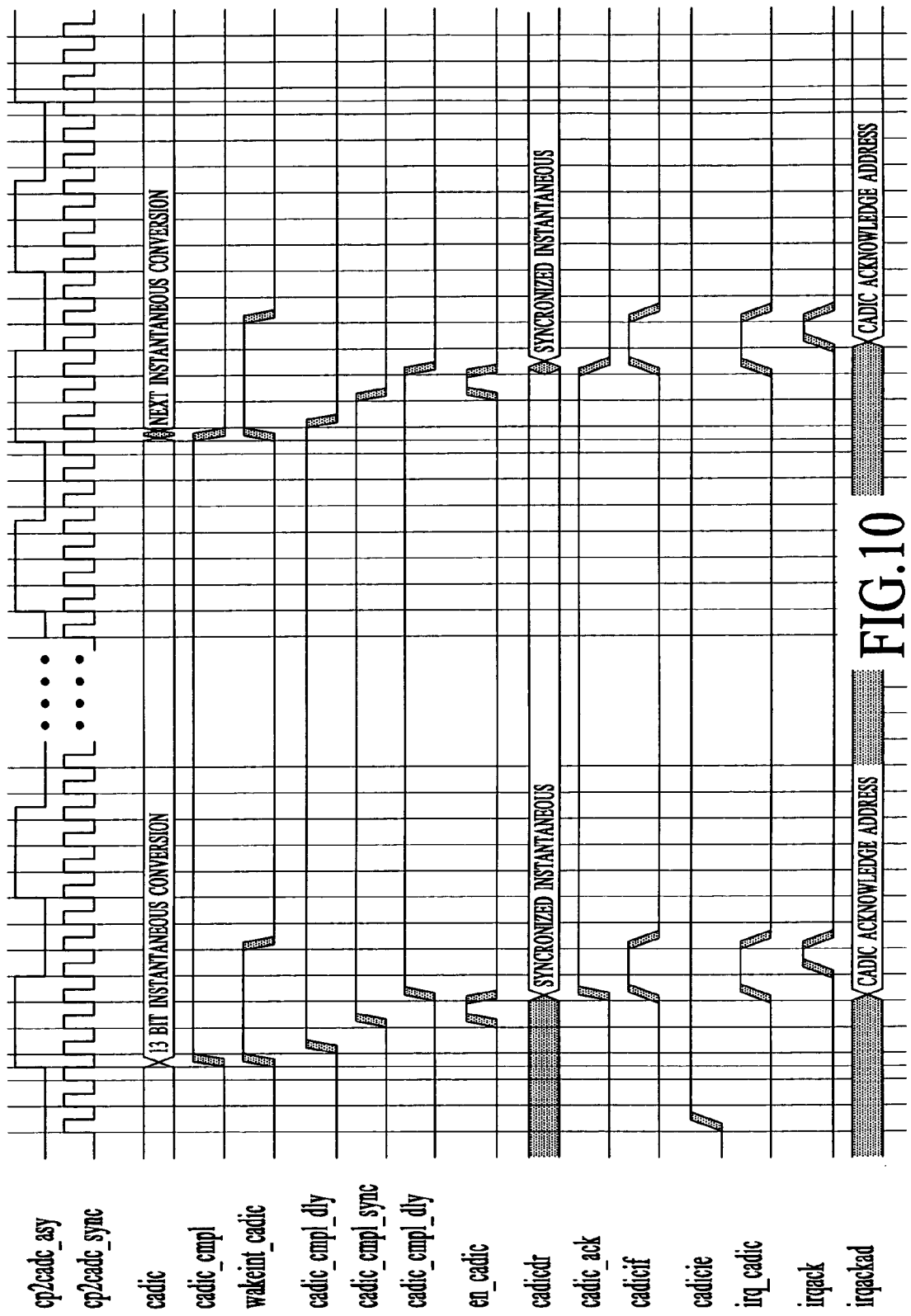
FIG. 10 shows the timing for the CS-ADC synchronization.

Note also that wake-up interrupts are given from the slow clock domain. The wakeint signals are asynchronous reset when the corresponding interrupt flag is cleared. FIG. 10 shows the timing for the CADIC synchronization.

Figure 11A:
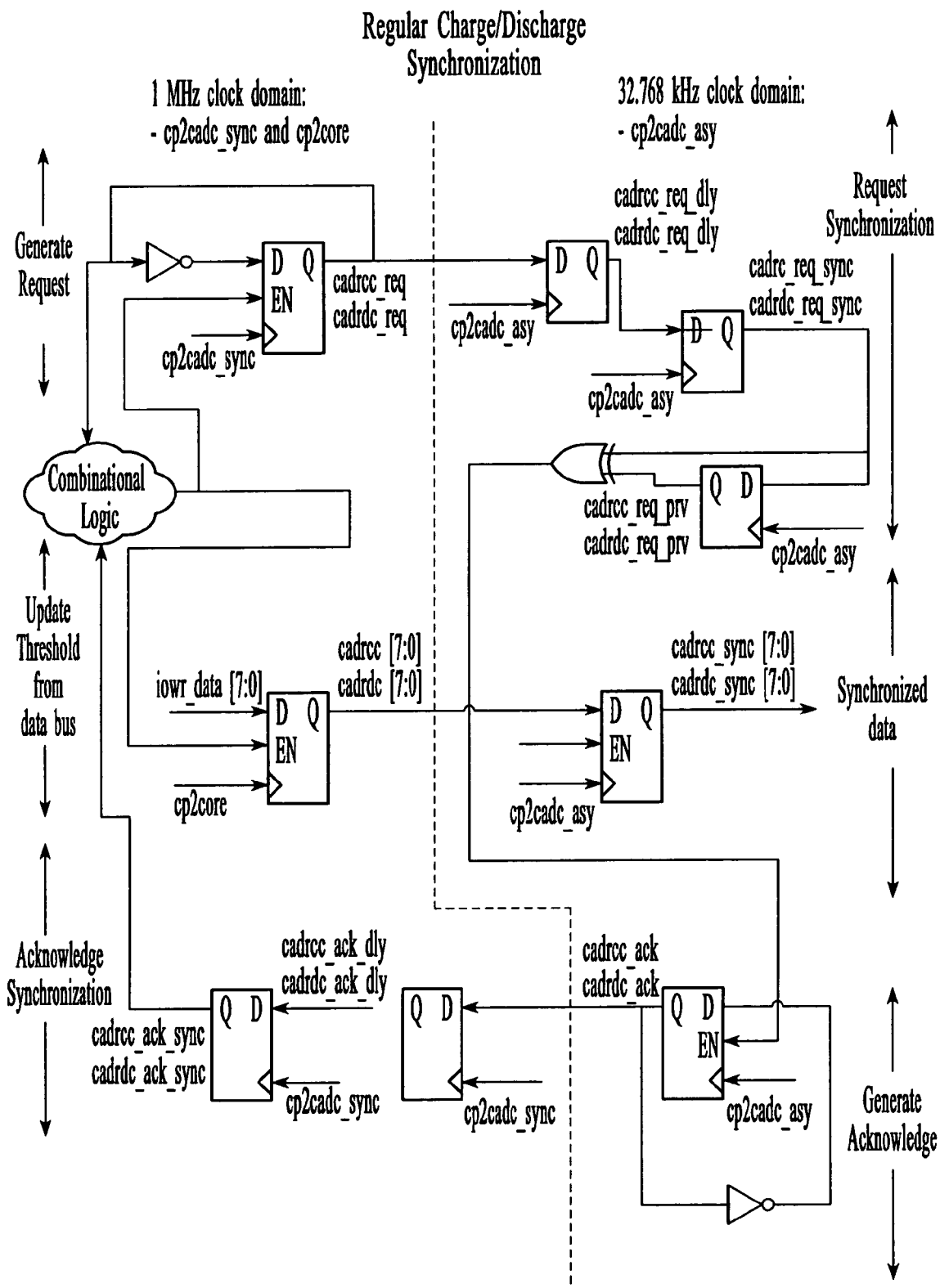
FIGS. 11a and 11b show the synchronization of the regular charge/discharge registers.
Figure 11B:
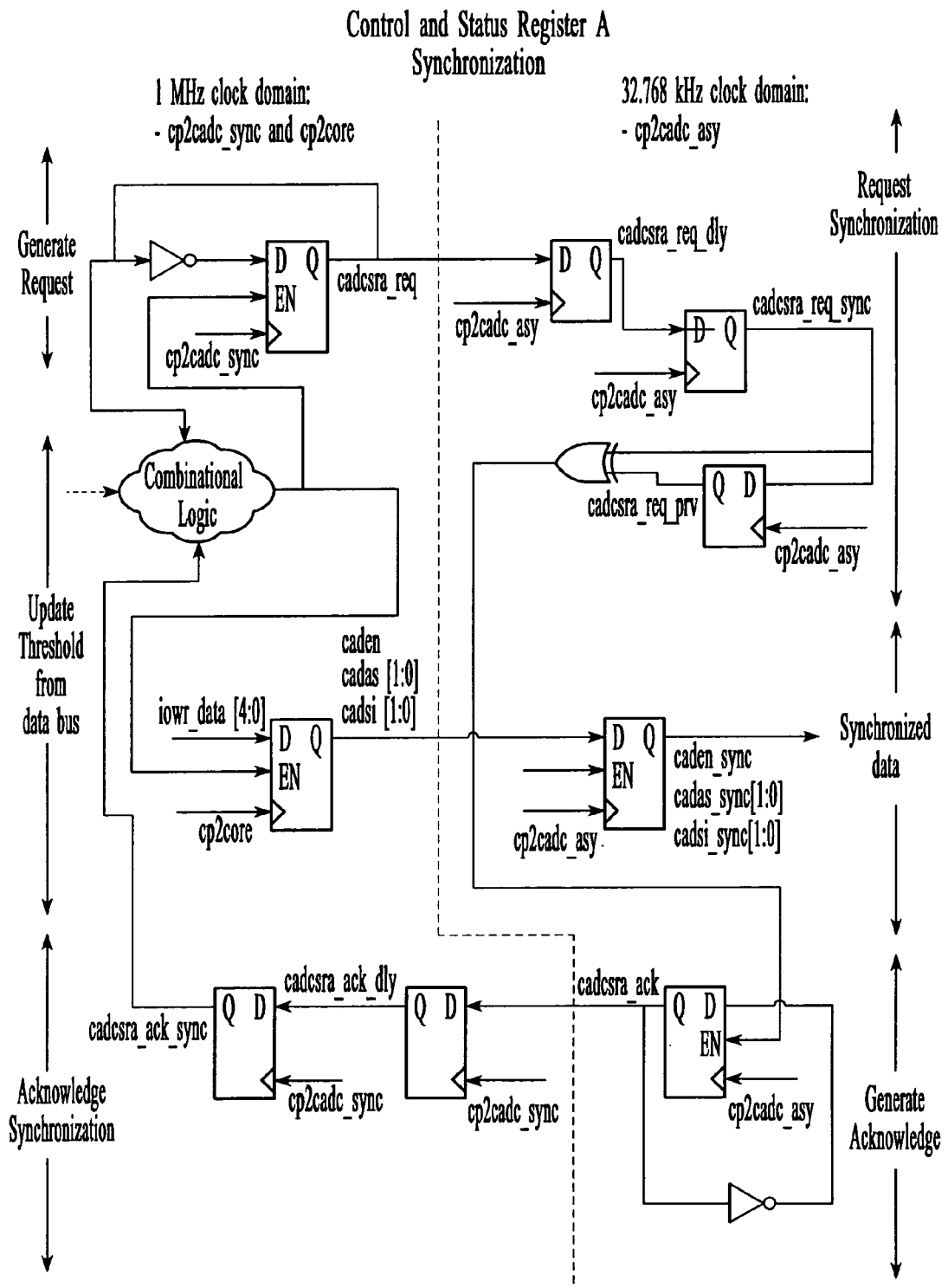
Figure 12:
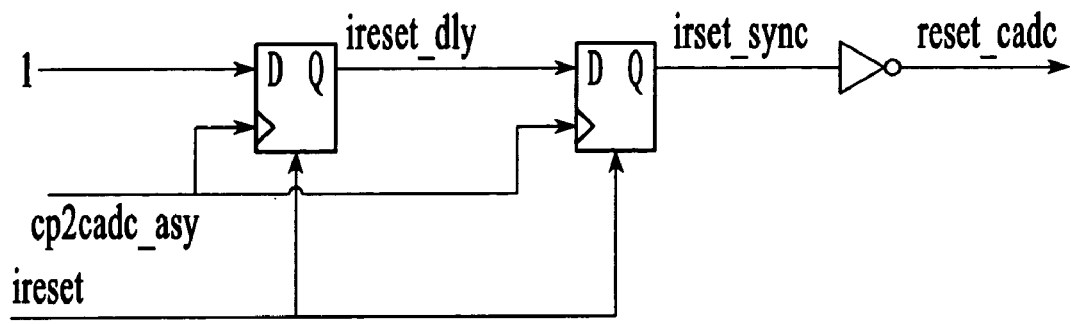
FIG. 12 shows the reset synchronization in the slow clock domain.
Figure 12:
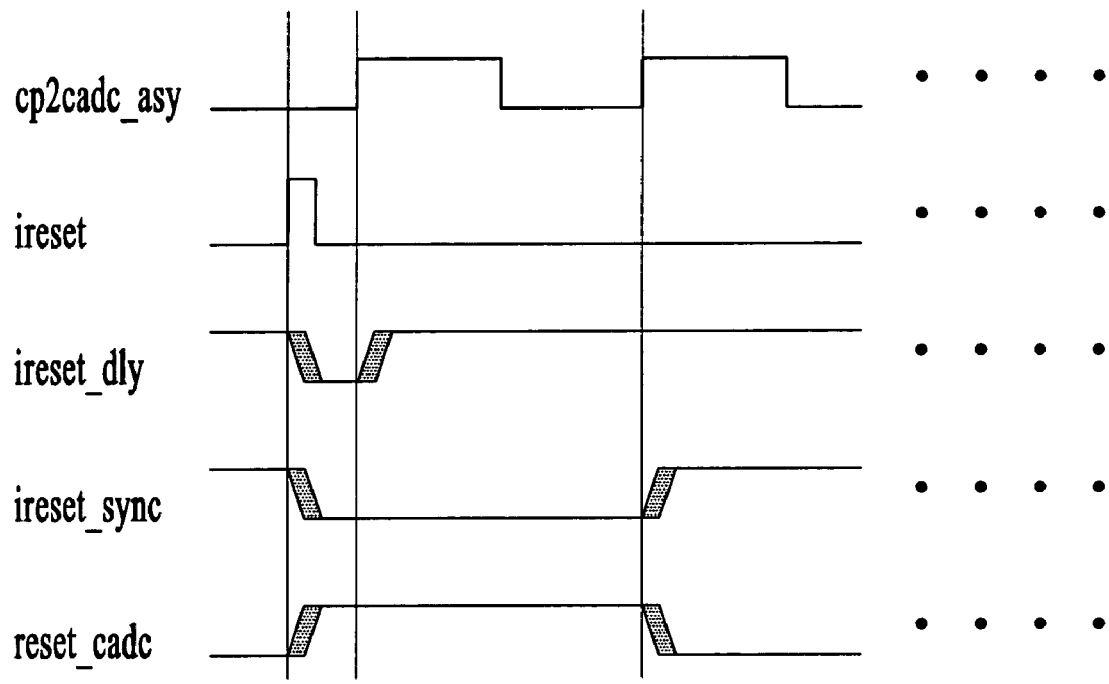

FIGS. 11*a* and 11*b* show the synchronization of the regular charge/discharge registers which is updated in the fast clock domain, but which the slow clock domain uses to compare detect a Regular Charge Current. The data value is copied from the fast to the slow clock domain using request/acknowledge synchronization, which are synchronized using the basic two-stage synchronizer. When the data register is updated in the fast clock domain, a request is toggled. Edge detection the toggle will generate a one clock period pulse in the slow clock domain, which is used to synchronize the data from the fast to the slow clock domain and to generate an acknowledge. Until acknowledge has been given from the slow clock domain the data registers could not be updated by the CPU. FIG. 12 shows the reset synchronization in the slow clock domain. The reset pulse will generate a asynchronous on, synchronous off reset in the slow clock domain. Note that the reset synchronization registers has asynchronous reset.

A current sensing analog to digital converter (CS-ADC) is disclosed that samples the charge or discharge current flowing through an external sense resistor $R_{SENSE}$. The sample from the $R_{SENSE}$ is processed by a delta-sigma modulator which generates an over sampled noise shaped signal. From this signal a decimation filter system removes the out-of band noise and reduces the data rate to achieve a high-resolution signal.

The CS-ADC also provides regular current detection. The regular current detection compares the data from conversion against charge/discharge threshold levels specified by the user. To save power a special mode where the user configures the regular current sampling interval is provided. This allows ultra-low power operation in power-save mode when small charge or discharge currents are flowing.

Although the present invention has been described in accordance with the embodiments shown, one of ordinary skill in the art will readily recognize that there could be variations to the embodiments and those variations would be within the spirit and scope of the present invention. The CS-ADC in accordance with the present invention can be utilized in a variety of devices such as a microcontroller, digital signal processor or other types of integrated circuits. Accordingly, many modifications may be made by one of ordinary skill in the art without departing from the spirit and scope of the appended claims.

What is claimed is:

1. A current sensing analog to digital converter (CS-ADC) comprising:
    a modulator adapted to sense a change in current and to generate an oversampled signal; and
    a decimation filter system coupled to the modulator for removing out of band noise from the signal and for reducing the data rate to achieve a high resolution signal, wherein the decimation filter system comprises a plurality of decimation filters, wherein the plurality of decimation filters generate an instantaneous current output signal for instantaneous current measurements and an accumulate current output signal for charge flow accumulation.

2. The CS-ADC of claim 1 wherein the plurality of decimation filters generate interrupts from the instantaneous current output signal and the accumulate current output signal.

3. The CS-ADC of claim 1 further comprising a detector of regular current, wherein the measured current level is compared to a specified threshold level.

4. The CS-ADC of claim 3 further comprising a low power mode of operation, wherein the CS-ADC measures the current flow during predefined intervals.

5. The CS-ADC of claim 4 wherein the CS-ADC is automatically turned off between measurements.

6. The CS-ADC of claim 3 wherein the regular current detector generates an interrupt when the measured current is above the specified threshold level.

7. The CS-ADC of claim 1 further including an I/O interface coupled to the decimation filter system.

8. The CS-ADC of claim 1 wherein the decimation filter system comprises a cascade integrator-comb combination (CIC) structure.

9. The CS-ADC of claim 8 wherein the CIC structure includes a first order sinc filter, a third order sinc filter, an integrator section and a differentiator section.

10. A microcontroller comprising:
    a controller; and
    a current sensing analog to digital converter (CS-ADC) within the controller, the CS-ADC further comprising a modulator adapted to sense a change in current, and to generate an oversampled signal; and a decimation filter system coupled to the modulator for removing out of band noise from the signal and for reducing the data rate to achieve a high resolution signal, wherein the decimation filter system comprises a plurality of decimation filters, wherein the plurality of decimation filters generate an instantaneous current output signal for instantaneous current measurements, and an accumulate current output signal for charge flow accumulation.

11. The microcontroller of claim 10 wherein the plurality of decimation filters generate interrupts from the instantaneous current output signal and the accumulate current output signal.

12. The microcontroller of claim 10 further comprising a detector of regular current, wherein the instantaneous current level is compared to a specified threshold level.

13. The microcontroller of claim 12 further comprising a low power mode of operation, wherein the microcontroller measures the current flow during predefined intervals.

14. The microcontroller of claim 13 wherein the CS-ADC is automatically turned off between measurements.

15. The CS-ADC of claim 12 wherein the regular current detector generates an interrupt when the measured current is above the specified threshold level.

16. The microcontroller of claim 10 further including an I/O interface coupled to the decimation filter system.

17. The microcontroller of claim 10 wherein the decimation filter system comprises a cascade integrator-comb combination (CIC) structure.

18. The microcontroller of claim 17 wherein the CIC structure includes a first order sinc filter, a third order sinc filter, an integrator section and a differentiator section.

* * * * *